(12) United States Patent
Lee et al.

(10) Patent No.: US 9,443,908 B2
(45) Date of Patent: Sep. 13, 2016

(54) ELECTRONIC DEVICE AND METHOD FOR FABRICATING THE SAME

(71) Applicant: SK HYNIX INC., Icheon (KR)

(72) Inventors: Dong-Hyeon Lee, Icheon (KR); Yun-Sun Choi, Icheon (KR)

(73) Assignee: SK HYNIX INC., Icheon (KR)

( * ) Notice: Subject to any disclaimer, the term of this patent is extended or adjusted under 35 U.S.C. 154(b) by 228 days.

(21) Appl. No.: 14/320,449

(22) Filed: Jun. 30, 2014

(65) Prior Publication Data
US 2015/0263070 A1  Sep. 17, 2015

(30) Foreign Application Priority Data

Mar. 17, 2014  (KR) .................. 10-2014-0030761

(51) Int. Cl.
| | |
|---|---|
| H01L 27/24 | (2006.01) |
| H01L 43/08 | (2006.01) |
| H01L 27/22 | (2006.01) |
| H01L 45/00 | (2006.01) |
| G06F 12/08 | (2016.01) |

(52) U.S. Cl.
CPC ......... *H01L 27/2463* (2013.01); *H01L 27/222* (2013.01); *H01L 43/08* (2013.01); *H01L 45/04* (2013.01); *H01L 45/06* (2013.01); *H01L 45/1226* (2013.01); *H01L 45/1253* (2013.01); *H01L 45/141* (2013.01); *H01L 45/146* (2013.01); *H01L 45/147* (2013.01); *H01L 45/1683* (2013.01); *G06F 12/0846* (2013.01); *G06F 12/0893* (2013.01)

(58) Field of Classification Search
None
See application file for complete search history.

(56) References Cited

U.S. PATENT DOCUMENTS

2015/0263070 A1* 9/2015 Lee .................... H01L 27/2463
                                                                711/118

FOREIGN PATENT DOCUMENTS

KR    10-1041742 B1    6/2011

* cited by examiner

*Primary Examiner* — Jack Chen

(57) ABSTRACT

An electronic device includes a semiconductor memory. The semiconductor memory includes a plurality of first pillar electrodes spaced apart from each other, a plurality of second pillar electrodes spaced apart from each other, each second pillar electrode being spaced apart from adjacent first pillar electrodes, and a plurality of variable resistance layers enclosing sidewalls of corresponding second pillar electrodes, respectively, wherein a group of adjacent first pillar electrodes is in contact with one variable resistance layer, and a group of adjacent variable resistance layers is in contact with one first pillar electrode.

13 Claims, 19 Drawing Sheets

ELECTRONIC DEVICE AND METHOD FOR FABRICATING THE SAME

CROSS-REFERENCE TO RELATED APPLICATIONS

The present application claims priority of Korean Patent Application No. 10-2014-0030761, entitled "ELECTRONIC DEVICE AND METHOD FOR FABRICATING THE SAME" and filed on Mar. 17, 2014, which is incorporated herein by reference in its entirety.

BACKGROUND

1. Field

This patent document relates to memory circuits or devices and their applications in electronic devices or system.

2. Description of the Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (Resistive Random Access Memory), a PRAM (Phase Change Random Access Memory), an FRAM (Ferroelectric Random Access Memory), an MRAM (Magnetic Random Access Memory), an E-fuse, etc.

SUMMARY

The disclosed technology in this patent document includes memory circuits or devices and their applications in electronic devices or systems and various implementations of an electronic device in which a semiconductor memory has improved integration degree, and a method for fabricating the same.

In an implementation, an electronic device includes a semiconductor memory, wherein the semiconductor memory includes: a plurality of first pillar electrodes that are spaced apart from each other; a plurality of second pillar electrodes that are respectively spaced apart from the first pillar electrodes; and variable resistance layers surrounding the second pillar electrodes, respectively, wherein a group of the first pillar electrodes contact with one variable resistance layer surrounding one second pillar electrode among the second pillar electrodes, and simultaneously, a group of the variable resistance layers contact with one first pillar electrode among the first pillar electrodes.

Implementations of the above electronic device may include one or more the following.

The electronic device may further include: a selection element layer interposed between the first pillar electrodes and the variable resistance layers or between the second pillar electrodes and the variable resistance layers.

The group of the first pillar electrodes contacting one variable resistance layer surrounding one second pillar electrode among the second pillar electrodes are disposed on both sides of the variable resistance layer in a first direction and a second direction which is crossed by the first direction, and the group of the variable resistance layers contacting with one first pillar electrode among the first pillar electrodes are disposed on both sides of the first pillar electrode in the first direction and the second direction. The first pillar electrodes and the second pillar electrodes are alternately disposed in the first direction and the second direction. The first pillar electrodes and the second pillar electrodes have a planar shape of circle or polygon including triangle, rectangle and pentagon and the like. The second pillar electrodes penetrate through the variable resistance layers. The variable resistance layers have the same height as the first pillar electrodes and the second pillar electrodes, or the variable resistance layers are shorter than the first pillar electrodes and the second pillar electrodes. The variable resistance layers include a metal oxide, a phase-change material, a ferroelectric material, or a ferromagnetic material.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance layers is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance layers is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the variable resistance layers is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance layers is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance layers is part of the memory or the buffer memory in the memory system.

In an implementation, an electronic device includes: a variable resistance element layer that includes a plurality of first pillar electrodes that are spaced apart from each other, a plurality of second pillar electrodes that are respectively spaced apart from the first pillar electrodes, and variable resistance layers surrounding the second pillar electrodes, respectively, where each of the variable resistance layers contacts with a group of the neighboring first pillar electrodes among the first pillar electrodes, a first line layer formed in a lower portion of the variable resistance element layer, and including a plurality of first conductive lines electrically connected to the first pillar electrodes, and a plurality of second conductive lines crossed by the first conductive lines and electrically connected to the second pillar electrodes; and a second line layer formed in an upper portion of the variable resistance element layer, and including a plurality of third conductive lines electrically connected to the second pillar electrodes, and a plurality of fourth conductive lines crossed by the third conductive lines and electrically connected to the first pillar electrodes.

Implementations of the above electronic device may include one or more the following.

The electronic device may further include: first contact plugs coupling the first pillar electrodes with the first conductive lines; second contact plugs coupling the second pillar electrodes with the second conductive lines; third contact plugs coupling the second pillar electrodes with the third conductive lines; fourth contact plugs coupling the first pillar electrodes with the fourth conductive lines; and a selection element layer interposed between the first pillar electrodes and the variable resistance layers or between the second pillar electrodes with the variable resistance layers.

The first conductive lines and the fourth conductive lines are extended in the same direction, and the first contact plugs and the fourth contact plugs are alternately disposed in the direction that the first conductive lines and the fourth conductive lines are extended. The second conductive lines and the third conductive lines are extended in the same direction, and the second contact plugs and the third contact plugs are alternately disposed in the direction that the second conductive lines and the third conductive lines are extended. The first conductive lines overlap with the fourth conductive lines, and the second conductive lines overlap with the third conductive lines. The first pillar electrodes overlap with the first conductive lines and the fourth conductive lines, and the first pillar electrodes are disposed between the second conductive lines or between the third conductive lines. The second pillar electrodes and the variable resistance layers overlap with the second conductive lines and the third conductive lines, and the second pillar electrodes and the variable resistance layers are disposed between the first conductive lines or between the fourth conductive lines. A group of the first pillar electrodes contact with one variable resistance layer surrounding one second pillar electrode among the second pillar electrodes, and simultaneously, a group of the variable resistance layers contact with one first pillar electrode among the first pillar electrodes. The group of the first pillar electrodes contacting with one variable resistance layer surrounding one second pillar electrode among the second pillar electrodes are disposed on both sides of the variable resistance layer in a first direction and a second direction which is crossed by the first direction, and the group of the variable resistance layers contacting with one first pillar electrode among the first pillar electrodes are disposed on both sides of the first pillar electrode in the first direction and the second direction. The group of the first pillar electrodes disposed on both sides of the variable resistance layer surrounding one second pillar electrode in the first direction are coupled with the first conductive lines, and the group of the first pillar electrodes disposed on both sides of the variable resistance layer surrounding one second pillar electrode in the second direction are coupled with the fourth conductive lines. The second pillar electrodes surrounded by the variable resistance layers disposed on both sides of one first pillar electrode in the first direction are coupled with the second conductive lines, and the second pillar electrodes surrounded by the variable resistance layers disposed on both sides of one first pillar electrode in the second direction are coupled with the third conductive lines.

In an implementation, an electronic device includes: a plurality of first conductive lines extended in a first oblique direction and disposed to be spaced apart from each other in a second oblique direction which is crossed by the first oblique direction; a plurality of second conductive lines extended in the second oblique direction and disposed to be spaced apart from each other in the first oblique direction; a plurality of fourth conductive lines disposed over the first conductive lines and overlapping with the first conductive lines; a plurality of first pillar electrodes disposed between the first conductive lines and the fourth conductive lines to be spaced apart from each other in the first oblique direction and overlapping with the first conductive lines and the fourth conductive lines; a plurality of third conductive lines disposed over the second conductive lines and overlapping with the second conductive lines; a plurality of second pillar electrodes disposed between the second conductive lines and the third conductive lines to be spaced apart from each other in the second oblique direction and overlapping with the second conductive lines and the third conductive lines; and variable resistance layers surrounding the second pillar electrodes, respectively, where each of the variable resistance layers contacts with a group of the neighboring first pillar electrodes among the first pillar electrodes.

Implementations of the above electronic device may include one or more the following.

The electronic device may further include: first contact plugs coupling the first pillar electrodes with the first conductive lines; second contact plugs coupling the second pillar electrodes with the second conductive lines; third contact plugs coupling the second pillar electrodes with the third conductive lines; fourth contact plugs coupling the first pillar electrodes with the fourth conductive lines; and a selection element layer interposed between the first pillar electrodes and the variable resistance layers or between the second pillar electrodes with the variable resistance layers.

The first contact plugs and the fourth contact plugs are alternately disposed in the first oblique direction, and the second contact plugs and the third contact plugs are alternately disposed in the second oblique direction. The first pillar electrodes and the second pillar electrodes are disposed in a form of matrix in the first oblique direction and the second oblique direction by being spaced apart with a predetermined gap there between. The first pillar electrodes are disposed between the second conductive lines and between the third conductive lines, and the second pillar electrodes and the variable resistance layers are disposed between the first conductive lines and between the fourth conductive lines. A group of the first pillar electrodes contact with one variable resistance layer surrounding one second pillar electrode among the second pillar electrodes, and simultaneously, a group of the variable resistance layers contact with one first pillar electrode among the first pillar electrodes. The second pillar electrodes are disposed between the first pillar electrodes, and four of the first pillar electrodes surround one second pillar electrode while four of the second pillar electrodes surround one first pillar electrode simultaneously.

In an implementation, a method for fabricating an electronic device includes: forming an inter-layer dielectric layer over a substrate; forming a plurality of variable resistance layers in the inter-layer dielectric layer; forming a plurality of first pillar electrodes penetrating through the inter-layer dielectric layer and contacting with the variable resistance layers; and forming a plurality of second pillar electrodes penetrating through the inter-layer dielectric layer and the variable resistance layers.

Implementations of the above method for fabricating an electronic device may include one or more the following.

A group of the first pillar electrodes contact with one variable resistance layer surrounding one second pillar electrode among the second pillar electrodes, and simultaneously, a group of the variable resistance layers contact with one first pillar electrode among the first pillar electrodes. The variable resistance layers include a metal oxide, and the inter-layer dielectric layer includes a nitride.

DETAILED DESCRIPTION

Figure 1:
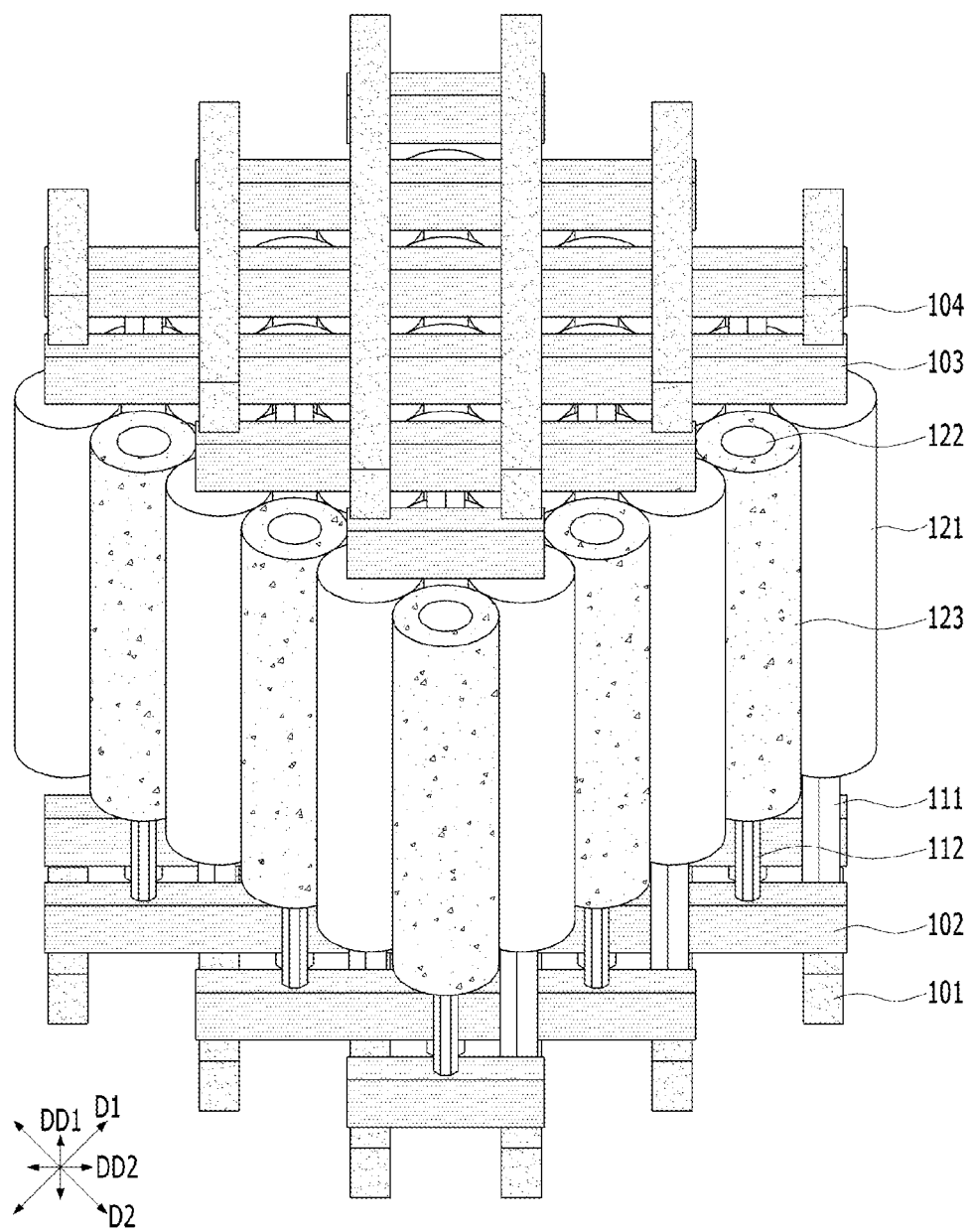
FIG. 1 is a perspective view illustrating a semiconductor memory in accordance with an embodiment of the present disclosure.

Various examples and implementations of the disclosed technology are described below in detail with reference to the accompanying drawings. The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The following embodiments of the present disclosure are directed to an electronic device including a semiconductor memory with a high degree of integration, and a method for fabricating the electronic device. The semiconductor memory may include a variable resistance element in which a variable resistance layer is interposed between two electrodes. In an embodiment, one of the two electrodes is divided into a plurality of electrodes, and the plurality of electrodes contacts the variable resistance layer. As a result, a plurality of memory cells shares the variable resistance layer. In this way, the degree of integration of the semiconductor memory may be increased.

The variable resistance element may switch between different resistance states in response to a bias (such as a current or a voltage) applied thereto. The variable resistance layer of the variable resistance element may include a variable resistance material used for a variable resistance memory in which data are programmed and erased based on the change in resistance characteristics of the variable resistance material. The variable resistance material may include any of various materials that are used for an RRAM (Resistive Random Access Memory), a PRAM (Phase Change Random Access Memory), an FRAM (Ferroelectric Random Access Memory), an MRAM (Magnetic Random Access Memory), an STTRAM (Spin Transfer Torque Magnetic Random Access Memory), etc. In some embodiments, the variable resistance material includes any of a metal oxide including a ferromagnetic material, a transition metal oxide, or a perovskite-based material, a phase-change material including a chalcogenide-based material, and a ferroelectric material. In embodiments of the present disclosure, a variable resistance element including a transition metal oxide is described for convenience in description, but the scope of the present disclosure is not limited thereto.

Hereafter, a first direction and a second direction may extend in a direction of the X-axis (e.g., an X-axis direction)

and a direction of the Y-axis (e.g., a Y-axis direction), respectively, or vice versa. The first direction and the second direction are orthogonal to each other on a plane in embodiments of the present disclosure. Also, a first oblique direction and a second oblique direction are directions that are slanted at a predetermined angle with respect to the first direction and the second direction, respectively. In an embodiment, the first oblique direction and the second oblique direction are directions slanted at approximately ±45° with respect to the first direction and the second direction, respectively.

Figure 2:
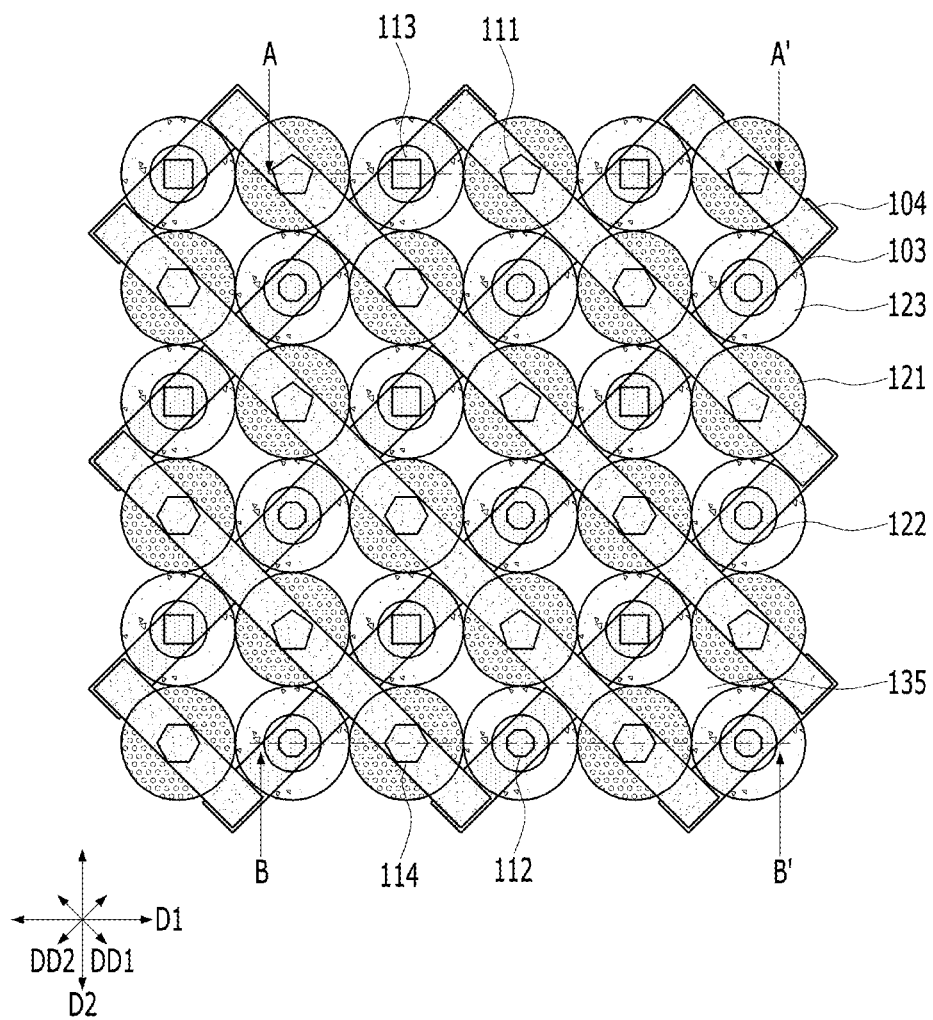
FIG. 2 is a plan view illustrating the semiconductor memory shown in FIG. 1.
Figure 3A:
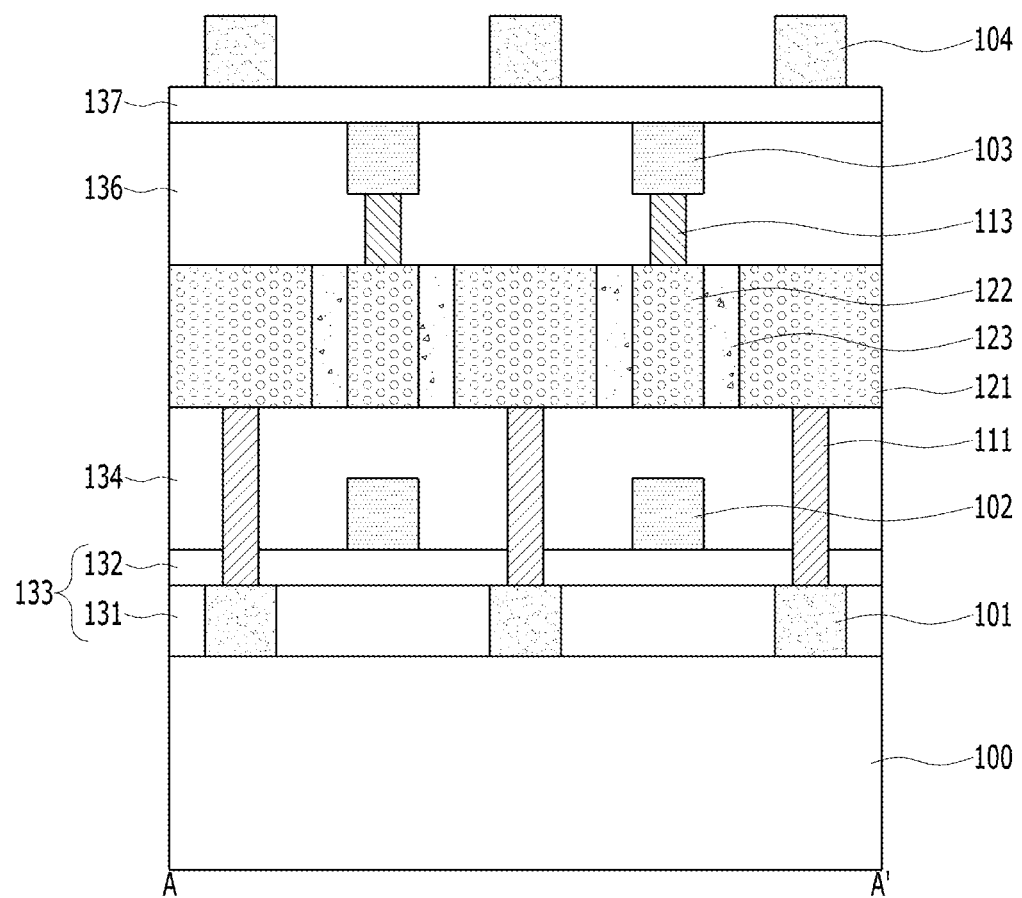
FIGS. 3A and 3B are cross-sectional views of the semiconductor memory shown in FIGS. 1 and 2 respectively taken along an A-A' line and a B-B' line.
Figure 3B:
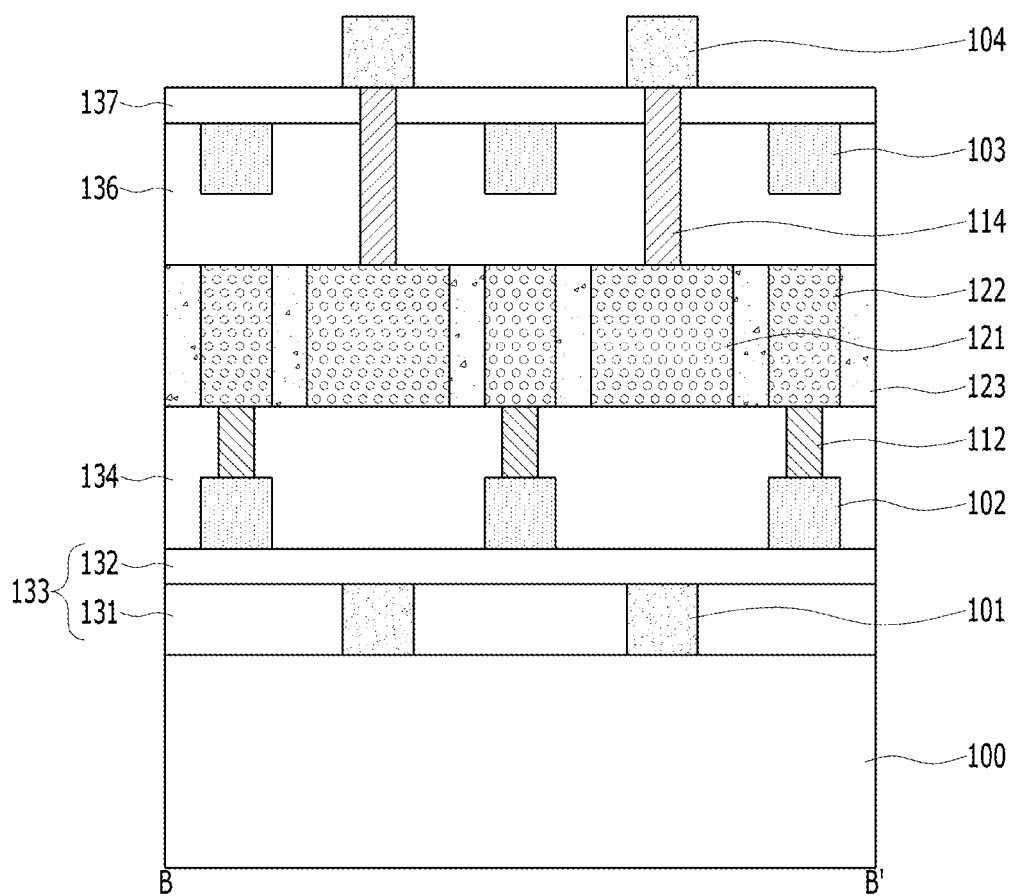

FIG. 1 is a perspective view illustrating a semiconductor memory in accordance with an embodiment of the present disclosure, and FIG. 2 is a plan view of the semiconductor memory shown in FIG. 1. FIGS. 3A and 3B are cross-sectional views of the semiconductor memory shown in FIGS. 1 and 2 respectively taken along an A-A' line and a B-B' line.

Referring to FIGS. 1, 2, and 3A and 3B, the semiconductor memory includes a first line layer, a variable resistance element layer, and a second line layer, which are sequentially stacked over a substrate 100. The first line layer includes a plurality of first conductive lines 101 and a plurality of second conductive lines 102. The first conductive lines 101 are substantially orthogonal to the second conductive lines 102. The second line layer includes a plurality of third conductive lines 103 and a plurality of fourth conductive lines 104. The third conductive lines 103 are substantially orthogonal to the fourth conductive lines 104. The variable resistance element layer includes a plurality of first pillar electrodes 121 that are spaced apart from each other, a plurality of second pillar electrodes 122 that are spaced apart from the first pillar electrodes 121, respectively, and variable resistance layers 123 each of which encloses a sidewall of a corresponding one of the second pillar electrodes 122. A group of adjacent first pillar electrodes among the first pillar electrodes 121 may be in contact with one variable resistance layer 123 that encloses a sidewall of a corresponding one of the second pillar electrodes 122. A group of adjacent variable resistance layers among the variable resistance layers 123 may be in contact with one of the first pillar electrodes 121. In an embodiment, as shown in FIGS. 1 and 2, four first pillar electrodes 121 surround and contact one variable resistance layer 123, and four variable resistance layers 123 surround and contact one first pillar electrode 121.

Hereafter, elements of a semiconductor memory in accordance with the embodiment of the present disclosure are described in more detail.

A semiconductor memory in accordance with an embodiment of the present disclosure includes a first line layer that is formed over the substrate 100. The first line layer includes predetermined structures formed therein and/or thereon. The first line layer includes the plurality of first conductive lines 101 that are formed over the substrate 100 and a first inter-layer dielectric layer 133, which includes a first dielectric layer 131 formed in the space between the first conductive lines 101 and a second dielectric layer 132 formed over the first conductive lines 101 and the first dielectric layer 131. The first line layer further includes the plurality of second conductive lines 102 that are formed over the first inter-layer dielectric layer 133 to cross the first conductive lines 101, a second inter-layer dielectric layer 134 that is formed over the first inter-layer dielectric layer 133 and covers the second conductive lines 102, a plurality of first contact plugs 111 that contacts the first conductive lines 101 by penetrating the second dielectric layer 132 and the second inter-layer dielectric layer 134, and a plurality of second contact plugs 112 that contacts the second conductive lines 102 by penetrating the second inter-layer dielectric layer 134.

The predetermined structures formed in and/or on the substrate 100 may include a drive transistor for driving conductive lines, e.g., the first and second conductive lines 101 and 102. The substrate 100 may be a semiconductor substrate. The semiconductor substrate may be of a monocrystalline state, and the semiconductor substrate may include a silicon-containing material. In an embodiment, the substrate 100 may be a bulk silicon substrate or a Silicon On Insulator (SOI) substrate in which a support substrate, a buried insulation layer, and a monocrystalline silicon layer are sequentially stacked.

The first conductive lines 101 may extend in a first oblique direction DD1 and may be spaced apart from each other in a second oblique direction DD2. The second conductive lines 102, which are formed over the first conductive lines 101 and cross the first conductive lines 101, may extend in the second oblique direction DD2 and may be spaced apart from each other in the first oblique direction DD1. Referring to FIG. 1 and FIGS. 3A and 3B, in an embodiment, the first conductive lines 101 and the second conductive lines 102 are vertically stacked and may be electrically isolated from each other by the second dielectric layer 132 of the first inter-layer dielectric layer 133. The first conductive lines 101 and the second conductive lines 102 may include a metallic material.

The first contact plugs 111 electrically couple the first conductive lines 101 to the first pillar electrodes 121, respectively, and the second contact plugs 112 electrically couple the second conductive lines 102 to the second pillar electrodes 122, respectively. The first contact plugs 111 and the second contact plugs 112 may include a metallic material. Each of the first contact plugs 111 and the second contact plugs 112 may be arranged in a matrix form with a predetermined gap in a first direction D1 and a second direction D2. The matrix form includes a plurality of rows extending in the first and second directions, respectively.

In an embodiment, only the first contact plugs 111 or only the second contact plugs 112 may be arranged to be spaced apart from each other on each of a plurality of lines extending along the first direction D1. Viewing FIG. 2 from top to bottom, the first contact plugs 111 are disposed on first lines in the first direction D1, and the second contact plugs 112 are disposed on second lines in the first direction D1, and the first lines on which the first contact plugs 111 are disposed alternate with the second lines on which second contact plugs 112 are disposed. That is, the first and second lines are alternately disposed in the second direction D2. On each of a plurality of lines extending along the second direction D2, the first contact plugs 111 and the second contact plugs 112 are alternately disposed. The first contact plugs 111 are arranged on the first conductive lines 101 such that they are spaced apart from each other in the first oblique direction DD1, and the second contact plugs 112 are arranged on the second conductive lines such that they are spaced apart from each other in the second oblique direction DD2.

The first inter-layer dielectric layer 133 and the second inter-layer dielectric layer 134 may include at least one of an oxide, a nitride, and an oxynitride. The first inter-layer dielectric layer 133 includes the first dielectric layer 131 and the second dielectric layer 132. The first dielectric layer 131 is formed over the substrate 100 and fills the space between the first conductive lines 101. The second dielectric layer 132 is disposed over the first dielectric layer 131 and between the first conductive lines 101. The second dielectric layer 132 not only electrically isolates the first conductive lines 101 from the second conductive lines 102, but also prevents the first conductive lines 101 from being damaged during a process of forming contact plugs. In an embodiment, the first dielectric layer 131 and the second inter-layer dielectric layer 134 include an oxide, and the second dielectric layer 132 includes a nitride.

A semiconductor memory in accordance with the embodiment of the present disclosure further includes a variable resistance element layer. The variable resistance element layer includes a third inter-layer dielectric layer 135 over the first line layer, the first pillar electrodes 121 and a plurality of the second pillar electrodes 122 that penetrate the third inter-layer dielectric layer 135, and the variable resistance layers 123 that respectively enclose the second pillar electrodes 122 and have outer sidewalls contacting the first pillar electrodes 121. Also, although not illustrated, the semiconductor memory may further include selection element layers each of which is in contact with a corresponding one of the variable resistance layers 123.

The first pillar electrodes 121 and the second pillar electrodes 122 may have a pillar shape vertically extending from the surface of the substrate 100. In a cross-section of a plan view, the first pillar electrodes 121 and the second pillar electrodes 122 may have a planar shape of a circle or a polygon such as a triangle, a rectangle, a pentagon, or the like. The first pillar electrodes 121 and the second pillar electrodes 122 may have substantially the same shape or different shapes.

In an embodiment, the first pillar electrodes 121 and the second pillar electrodes 122 have a planar shape of a circle in order to effectively control a contact area between the variable resistance layers 123 and the first pillar electrodes 121 and to simplify a manufacturing process. Accordingly, the first pillar electrodes 121 and the second pillar electrodes 122 have a cylindrical shape in three dimensions.

The first pillar electrodes 121 and the second pillar electrodes 122 may have substantially the same height or different heights. The height of the first pillar electrodes 121 may be the same as, or greater or smaller than the height of the variable resistance layers 123. Accordingly, the contact area between the first pillar electrodes 121 and the variable resistance layers 123 may be controlled by the height of the first pillar electrodes 121 when the first pillar electrodes 121 are formed after the formation of the variable resistance layers 123. However, embodiments are not limited thereto. In another embodiment, the contact area between the first pillar electrodes 121 and the variable resistance layers 123 may be controlled by the height of the variable resistance layers 123 when the first pillar electrodes 121 are formed before the formation of the variable resistance layers 123.

The height of the second pillar electrodes 122 may be the same as or greater than the height of the variable resistance layers 123. In an embodiment, the second pillar electrodes 122 are formed to penetrate the variable resistance layers 123. That is, after the variable resistance layers 123 are formed in a cylinder shape, the second pillar electrodes 122 are formed by etching central portions of the variable resistance layers 123 to form holes and filling the holes with an electrode material.

The first pillar electrodes 121 and the second pillar electrodes 122 may include a metallic material. In an embodiment, the first pillar electrodes 121 and the second pillar electrodes 122 include a titanium nitride (TiN).

Each of the first pillar electrodes 121 and the second pillar electrodes 122 may be arranged in a matrix form with a predetermined space between the first pillar electrodes 121 and the second pillar electrodes 122 in the first oblique direction DD1 and the second oblique direction DD2. The first pillar electrodes 121 and the second pillar electrodes 122 may be disposed in a zigzag pattern in the first direction D1 and the second direction D2. In other words, the first pillar electrodes 121 and the second pillar electrodes 122 may be alternately disposed in the first direction D1 and the second direction D2. As a result, the second pillar electrodes 122 may be disposed between the first pillar electrodes 121, and one second pillar electrode 122 may be surrounded by a group of first pillar electrodes 121, e.g., four first pillar electrodes 121. In other words, the first pillar electrodes 121 may be disposed between the second pillar electrodes 122, and one first pillar electrode 121 may be surrounded by a group of second pillar electrodes 122, e.g., four second pillar electrodes 122. The first pillar electrodes 121 may overlap with the first conductive lines 101 and may be disposed in a region corresponding to the space between the second conductive lines 102. The second pillar electrodes 122 may overlap with the second conductive lines 102 and be disposed in a region corresponding to the space between the first conductive lines 101.

The variable resistance layers 123 may switch between different resistance states in response to a bias applied thereto, and the variable resistance layers 123 may include a variable resistance material. In an embodiment, the variable resistance layers 123 include a transition metal oxide. In a cross-section of a plan view, the variable resistance layers 123, which enclose sidewalls of the second pillar electrodes 122, may have a planar shape of ring. Outer sidewalls of the variable resistance layers 123 contact the first pillar electrodes 121. In an embodiment, an outer sidewall of each of the variable resistance layers 123 is in contact with sidewalls of four surrounding first pillar electrodes 121.

The variable resistance layers 123 may partially overlap with the second conductive lines 102 but may not contact the second contact plugs 112 disposed over the second conductive lines 102. The variable resistance layers 123 may be disposed in a region corresponding to the space between the first conductive lines 101. The variable resistance layers 123 may penetrate the third inter-layer dielectric layer 135 or be buried in the third inter-layer dielectric layer 135 instead of completely penetrating the third inter-layer dielectric layer 135. Accordingly, the variable resistance layers 123 buried in the third inter-layer dielectric layer 135 may have a smaller height than the third inter-layer dielectric layer 135.

The third inter-layer dielectric layer 135 may include any one of an oxide, a nitride, and an oxynitride. In an embodiment, the third inter-layer dielectric layer 135 may be a nitride. When the third inter-layer dielectric layer 135 is a nitride, the third inter-layer dielectric layer 135 may prevent deterioration of characteristics of the variable resistance layers 123 when the variable resistance layers 123 is formed of a transition metal oxide.

As described above, in some embodiments, the semiconductor memory may further include selection element layers that are in contact with the variable resistance layers 123. A selection element layer controls the supply of bias, e.g., a current or voltage, to the variable resistance layers 123. The selection element layer may include any device having non-linear current-voltage characteristics and capable of cutting off a current at a voltage level that is below a predetermined threshold voltage and letting the current flow at a voltage level that is equal to or higher than the predetermined threshold voltage. The selection element layer may include any of a diode, a transistor, a varistor, a Metal-Insulator Transition (MIT) device, a tunneling barrier, and the like. The selection element layer may be in contact with an inner sidewall or an outer sidewall of the variable resistance layer 123. That is, the selection element layer may be disposed between the first pillar electrodes 121 and the variable resistance layers 123, or between the variable resistance layers 123 and the second pillar electrodes 122.

A semiconductor memory in accordance with the embodiment of the present disclosure further includes a second line layer. The second line layer includes a fourth inter-layer dielectric layer 136 formed over the variable resistance element layer, the third conductive lines 103 formed in an upper portion of the fourth inter-layer dielectric layer 136, and a fifth inter-layer dielectric layer 137 formed over the fourth inter-layer dielectric layer 136 and covering the third conductive lines 103 and the fourth inter-layer dielectric layer 136. The second line layer also includes the fourth conductive lines 104 formed over the fifth inter-layer dielectric layer 137 and crossing the third conductive lines 103, a plurality of third contact plugs 113 disposed in a lower portion of the fourth inter-layer dielectric layer 136 and having opposing ends that are in contact with the third conductive lines 103 and the second pillar electrodes 122, respectively, and a plurality of fourth contact plugs 114 penetrating the fourth inter-layer dielectric layer 136 and the fifth inter-layer dielectric layer 137 and having opposing ends that are in contact with the fourth conductive lines 104 and the first pillar electrodes 121, respectively.

The third conductive lines 103 may extend in the second oblique direction DD2 and be spaced apart from each other in the first oblique direction DD1. The third conductive lines 103 may overlap with the second conductive lines 102. In an embodiment, the third conductive lines 103 are disposed over the second conductive lines 102 in a region corresponding to a region in which the second conductive lines 102 are disposed.

The fourth conductive lines 104, which are formed over the third conductive lines 103 and cross the third conductive lines 103, extend in the first oblique direction DD1 and are spaced apart from each other in the second oblique direction DD2. The fourth conductive lines 104 may overlap with the first conductive lines 101. In an embodiment, the fourth conductive lines 104 are disposed over the first conductive lines 101 in a region corresponding to a region in which the first conductive lines 101 are disposed. In an embodiment, the fourth conductive lines 104 are disposed over and aligned with the first conductive lines 101. The third conductive lines 103 and the fourth conductive lines 104 may be electrically isolated from each other by the fifth inter-layer dielectric layer 137. The third conductive lines 103 and the fourth conductive lines 104 may include a metallic material.

The third contact plugs 113 electrically couple the second pillar electrodes 122 to the third conductive lines 103, and the fourth contact plugs 114 electrically couple the first pillar electrodes 121 to the fourth conductive lines 104. Each of the third contact plugs 113 and the fourth contact plugs 114 may be arranged in a matrix form with a predetermined space in the first direction D1 and the second direction D2. In an embodiment, only the third contact plugs 113 or only the fourth contact plugs 114 are arranged to be spaced apart from each other along each line in the first direction D1. Viewing FIG. 2 from top to bottom, the third contact plugs 113 are disposed on first lines in the first direction D1, and the fourth contact plugs 114 are disposed on second lines in the first direction D1, the first lines being alternate with the second lines in the second direction D2. The third contact plugs 113 and the fourth contact plugs 114 are alternately disposed on each line in the second direction D2. The third contact plugs 113 are spaced apart from each other by a predetermined space in the second oblique direction DD2 along the second conductive lines 102 or the third conductive lines 103, and the fourth contact plugs 114 are spaced apart from each other by a predetermined space in the first oblique direction DD1 along the first conductive lines 101 or the fourth conductive lines 104.

As shown in the plan view of FIG. 2, the first contact plugs 111 and the third contact plugs 113 are alternately disposed in the first direction D1, and the second contact plugs 112 and the fourth contact plugs 114 are alternately disposed in the first direction D1. In the second direction D2, the first contact plugs 111 and the second contact plugs 112 are alternately disposed, and the third contact plugs 113 and the fourth contact plugs 114 are alternately disposed. The first contact plugs 111 and the fourth contact plugs 114 are alternately disposed in the first oblique direction DD1. The second contact plugs 112 and the third contact plugs 113 are alternately disposed in the second oblique direction DD2.

The fourth inter-layer dielectric layer 136 and the fifth inter-layer dielectric layer 137 may include at least one of an oxide, a nitride, and an oxynitride. In an embodiment, the fourth inter-layer dielectric layer 136 is an oxide layer, and the fifth inter-layer dielectric layer 137 is a nitride layer.

A semiconductor memory in accordance with the embodiment of the present disclosure may have an increased degree of integration since a group of first pillar electrodes 121, e.g., 4 first pillar electrodes 121, is in contact with one variable resistance layer 123. That is, since one variable resistance layer is used to form a plurality of memory cells, a higher degree of integration can be obtained.

Also, since the first pillar electrodes 121, the second pillar electrodes 122, and the variable resistance layers 123 have a pillar shape, it is easier to control the contact area between respective electrodes and layers. Accordingly, when embodiments of the present disclosure are applied to a phase-change memory in which a contact area between a variable resistance element layer and an electrode has an influence on operational characteristics of the memory, the operational characteristics may be improved.

Hereafter, a method for fabricating a semiconductor memory in accordance with an embodiment will be described. The fabrication method, which is to be described below, may also clarify aspects of embodiments of a semiconductor memory as shown in FIGS. 1 to 3B.

FIGS. 4A to 8C illustrate a method for fabricating a semiconductor memory in accordance with an embodiment of the present disclosure. FIGS. 4A, 5A, 6A, 7A and 8A are plan views of the semiconductor memory. FIGS. 4B, 5B, 6B, 7B and 8B and FIGS. 4C, 5C, 6C, 7C and 8C are cross-sectional views of the semiconductor memory shown in FIGS. 4A, 5A, 6A, 7A and 8A respectively taken along an A-A' line and a B-B' line.

Figure 4A:
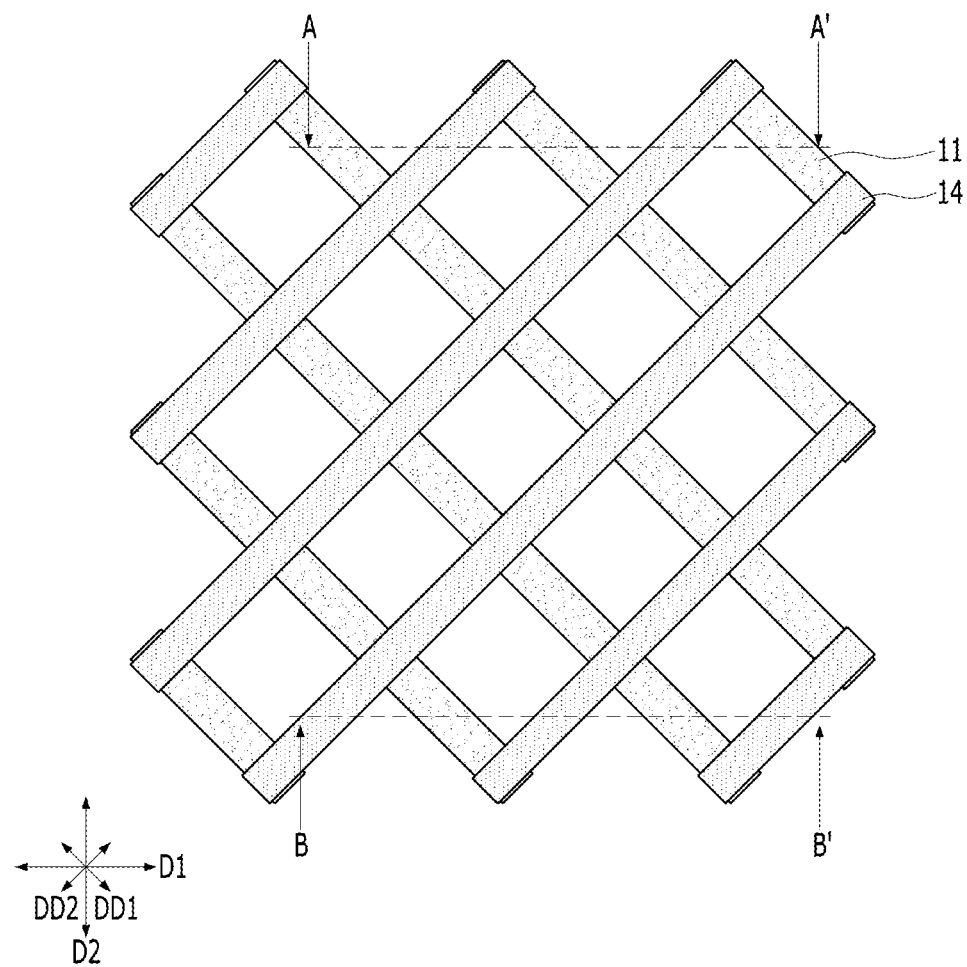
FIGS. 4A to 8C illustrate a method for fabricating a semiconductor memory in accordance with an embodiment of the present disclosure.
Figure 4B:
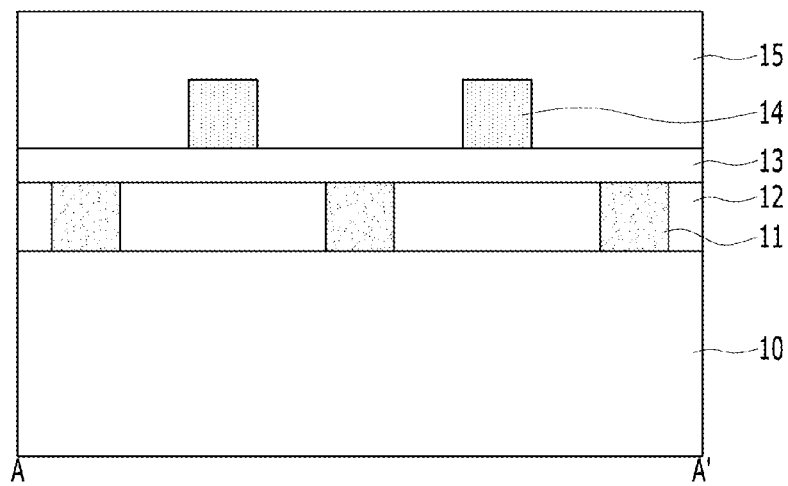
Figure 4C:
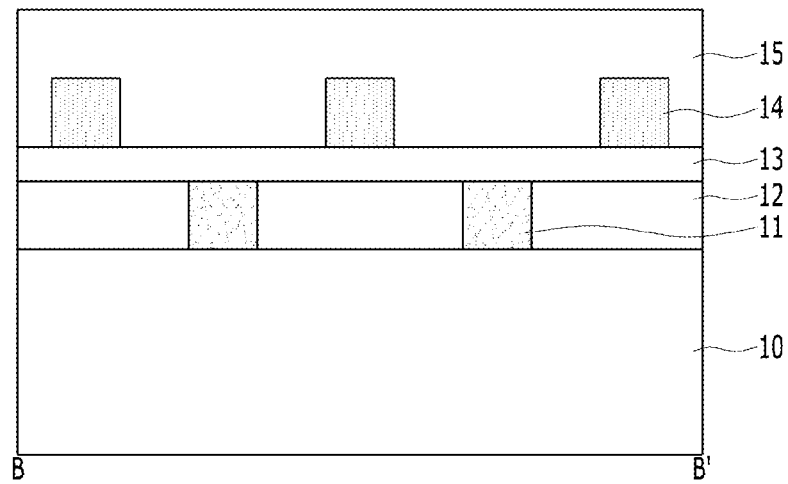

Referring to FIGS. 4A, 4B and 4C, a substrate 10 including a predetermined structure, such as a driving transistor, is provided. The substrate 10 may be a semiconductor substrate, and it may include a monocrystalline silicon-containing material.

Subsequently, a plurality of first conductive lines 11 are formed over the substrate 10. The plurality of first conductive lines 11 extends in a first oblique direction DD1. The first conductive lines 11 are spaced apart from each other in a second oblique direction DD2. The first conductive lines 11 may include a metallic material. Although not illustrated, in an embodiment, the substrate 10 and the first conductive lines 11 may be electrically disconnected from each other, and the predetermined structure provided with the substrate 10 may be coupled to the first conductive lines 11.

Subsequently, a first inter-layer dielectric layer covering the first conductive lines 11 is formed over the substrate 10. The first inter-layer dielectric layer includes a first dielectric layer 12 filling the space between the first conductive lines 11 and a second dielectric layer 13 covering the first conductive lines 11 and the first dielectric layer 12. The first inter-layer dielectric layer may include at least one of an oxide, a nitride, and an oxynitride. In an embodiment, the first dielectric layer 12 is an oxide layer, and the second dielectric layer 13 is a nitride layer.

Subsequently, a plurality of second conductive lines 14 is formed over the second dielectric layer 13. The second conductive lines 14 extend in the second oblique direction DD2, and are spaced apart from each other in the first oblique direction DD1. The second conductive lines 14 cross the first conductive lines 11. The second conductive lines 14 may include a metallic material.

Subsequently, a second inter-layer dielectric layer 15 covering the second conductive lines 14 is formed over the first inter-layer dielectric layer. The second inter-layer dielectric layer 15 may include at least one of an oxide, a nitride, and an oxynitride. In an embodiment, the second inter-layer dielectric layer 15 is an oxide layer.

Figure 5A:
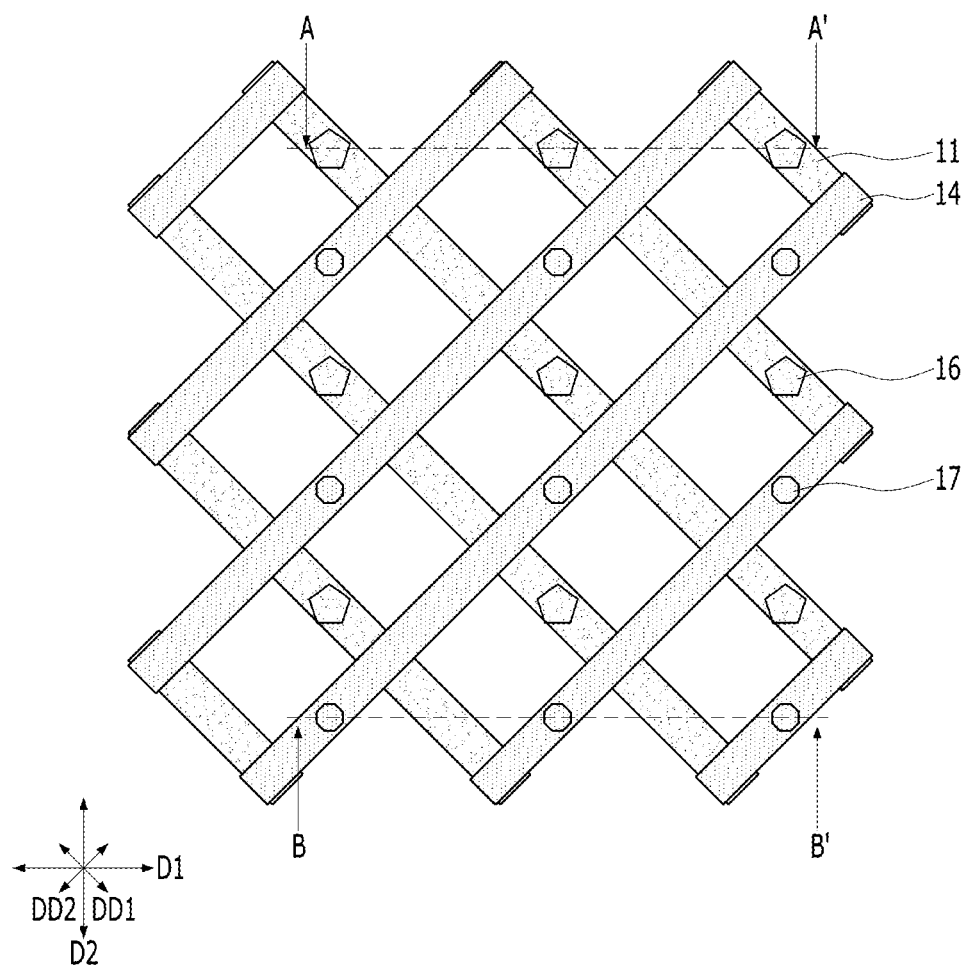
Figure 5B:
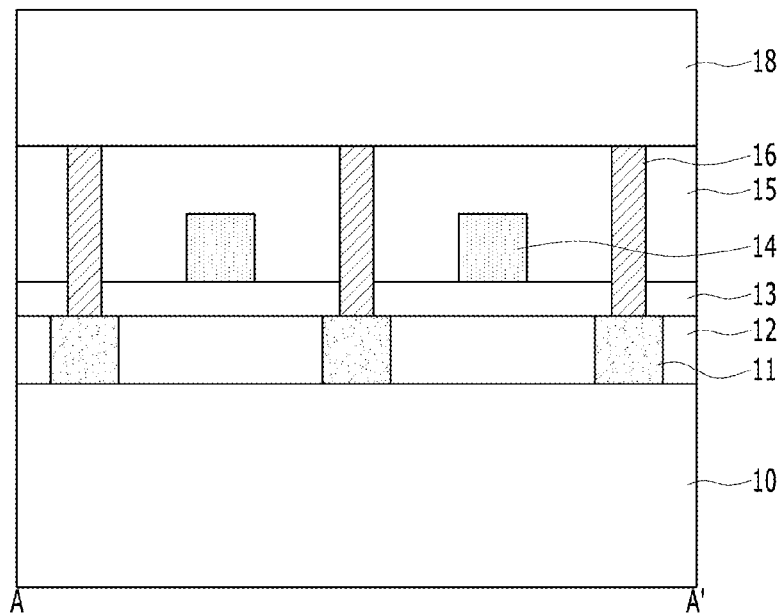
Figure 5C:
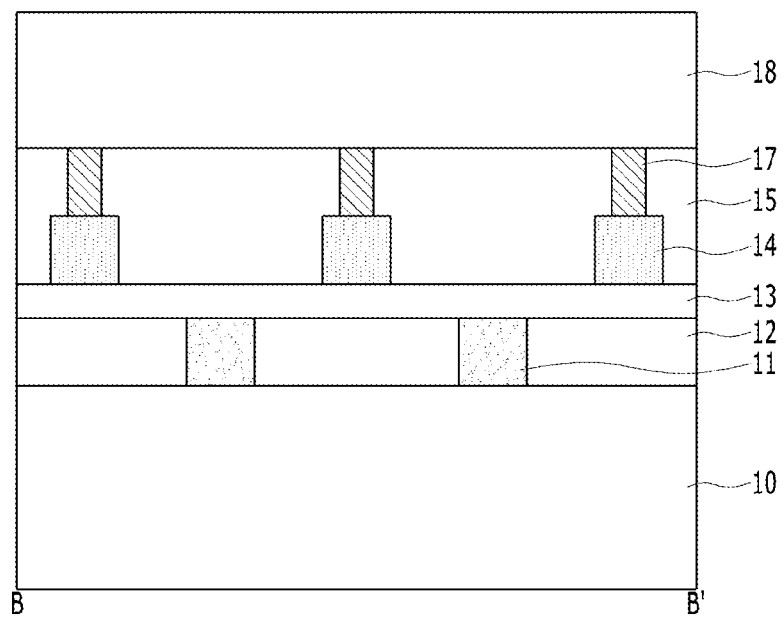

Referring to FIGS. 5A, 5B and 5C, a plurality of first contact plugs 16 and a plurality of second contact plugs 17 are formed to penetrate the second dielectric layer 13 and the second inter-layer dielectric layer 15 so that the first contact plugs 16 and the second contact plugs 17 are in contact with the first conductive lines 11 and the second conductive lines 14, respectively. The first contact plugs 16 and the second contact plugs 17 may include a metallic material. The first contact plugs 16 and the second contact plugs 17 may be formed through different processes, or may be formed concurrently.

The first contact plugs 16 and the second contact plugs 17 may be formed by selectively etching the second dielectric layer 13 and the second inter-layer dielectric layer 15 to form contact holes that expose the first conductive lines 11 and the second conductive lines 14, filling the contact holes with a conductive material, and performing a planarization process until a top surface of the second inter-layer dielectric layer 15 is exposed. As a result, the first and second contact plugs 16 and 17 are isolated from each other. The planarization process may be a Chemical Mechanical Polishing (CMP) or a blanket etch process.

Subsequently, a third inter-layer dielectric layer 18 is formed over a resultant structure including the first contact plugs 16 and the second contact plugs 17. The third inter-layer dielectric layer 18 may include at least one of an oxide, a nitride, and an oxynitride. In an embodiment, if a variable resistance layer which is to be formed in a subsequent process is a metal oxide layer, the third inter-layer dielectric layer 18 is a nitride layer. This is because, when the third inter-layer dielectric layer 18 includes an oxide, characteristics of a metal oxide variable resistance layer may be deteriorated due to an oxygen component in the third inter-layer dielectric layer 18. Accordingly, when the third inter-layer dielectric layer 18 includes a nitride, it is possible to prevent the deterioration of the characteristics of the variable resistance layer.

Figure 6A:
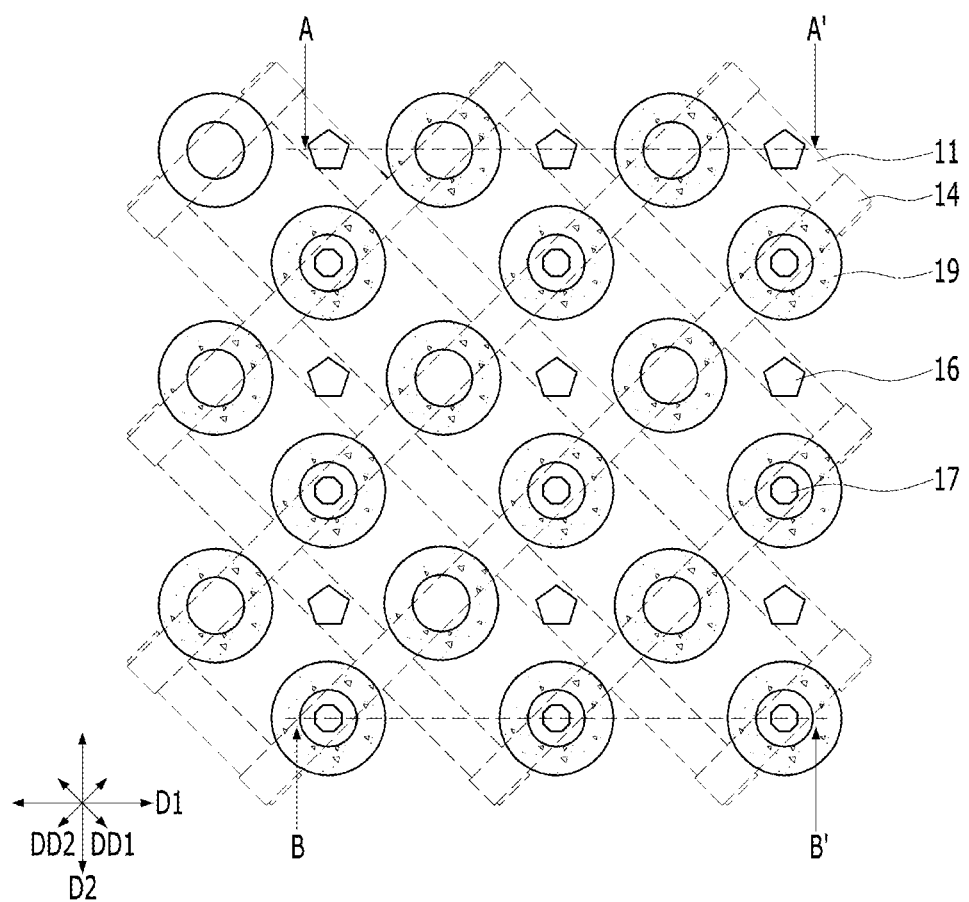
Figure 6B:
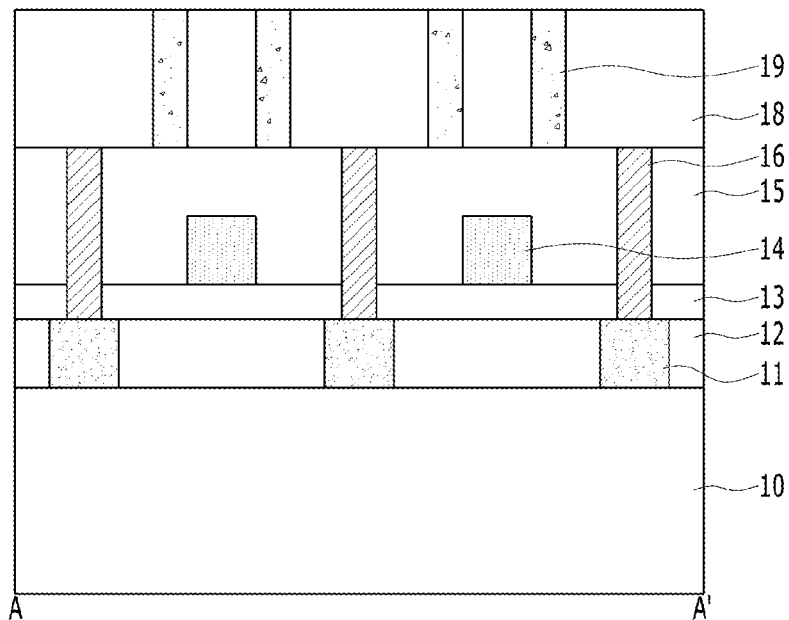
Figure 6C:
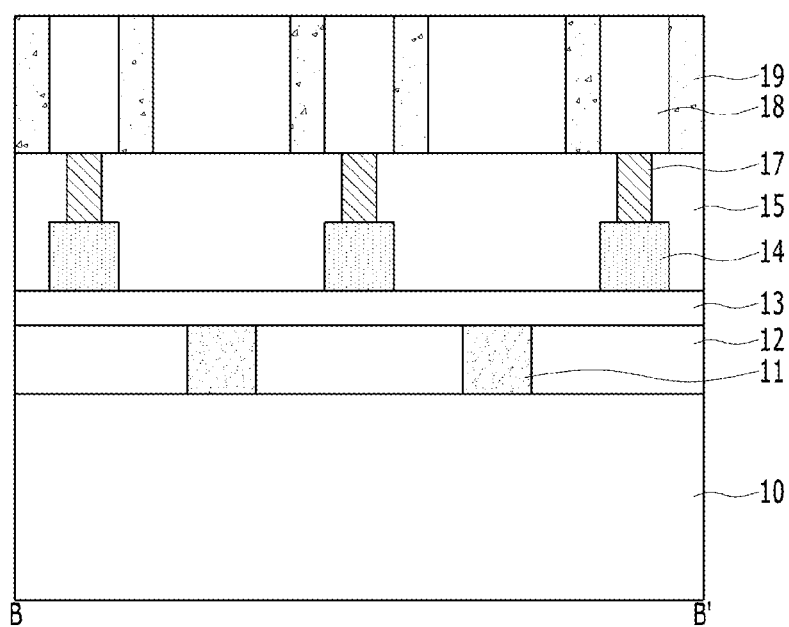

Referring to FIGS. 6A, 6B and 6C, a plurality of variable resistance layers 19 are formed in the third inter-layer dielectric layer 18 and over the second conductive lines 14. The variable resistance layers 19 may be formed in a pillar shape. In a cross-section of a plan view, the variable resistance layers 19 have a planar shape of ring. The variable resistance layers 19 may completely penetrate the third inter-layer dielectric layer 18 or may be buried in the third inter-layer dielectric layer 18. The variable resistance layers 19, which are disposed over the second conductive lines 14, may partially overlap with the second conductive lines 14 and may be disposed in a region corresponding to the space between the first conductive lines 11. The variable resistance layers 19 may be formed over the second contact plugs 17 that are disposed over the second conductive lines 14. However, the variable resistance layers 19 are not formed directly over the second contact plugs 17, ant thus, they are not in contact with the second contact plugs 17. The variable resistance layers 19 may include a metal oxide.

The variable resistance layers 19 may be formed by selectively etching the third inter-layer dielectric layer 18 to form openings or trenches, filling the openings or trenches with a variable resistance material, and performing a planarization process until a top surface of the third inter-layer dielectric layer 18 is exposed. As a result, the variable resistance layers 19 are isolated from each other. In FIG. 6, openings are formed to penetrate the third inter-layer dielectric layer 18 so that the second inter-layer dielectric layer 15 is exposed. In another embodiment, trenches are formed, which do not completely penetrate the third inter-layer dielectric layer 18. That is, the trenches may be formed so that the second inter-layer dielectric layer 15 is not exposed. The planarization process may be a Chemical Mechanical Polishing (CMP) process. In accordance with this embodiment, since no etch process is performed on the variable resistance layers 19, a problem occurring when performing an etch process directly on the variable resistance layers 19 may be prevented.

Although not illustrated in the drawings, when the variable resistance layers 19 are formed, selection element layers may be formed as well. The selection element layers may be formed to contact inner sidewalls or outer sidewalls of the variable resistance layers 19.

Figure 7A:
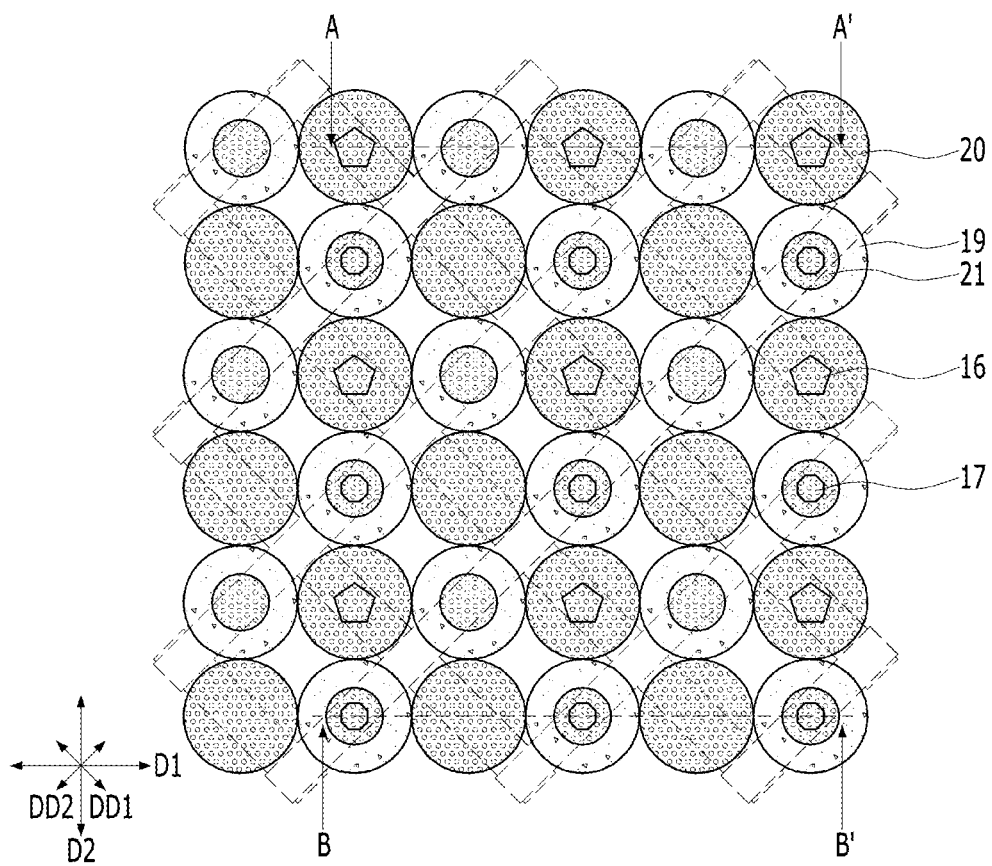
Figure 7B:
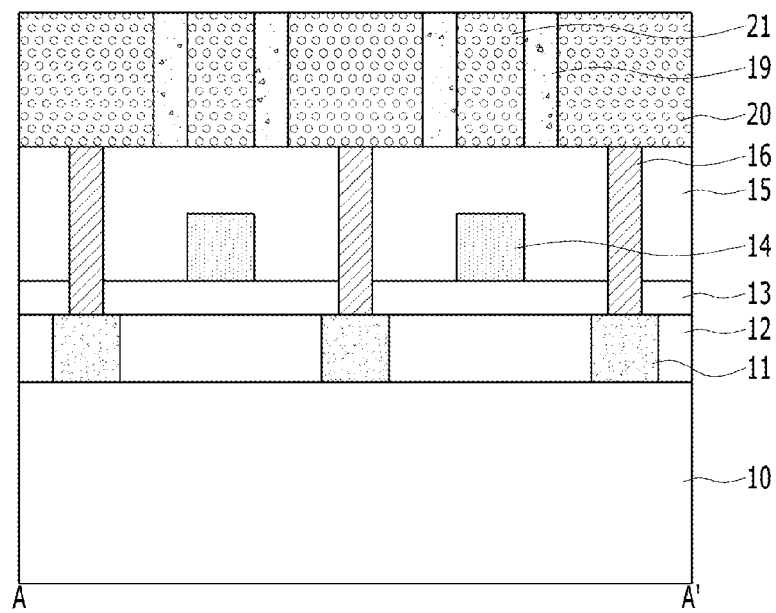
Figure 7C:
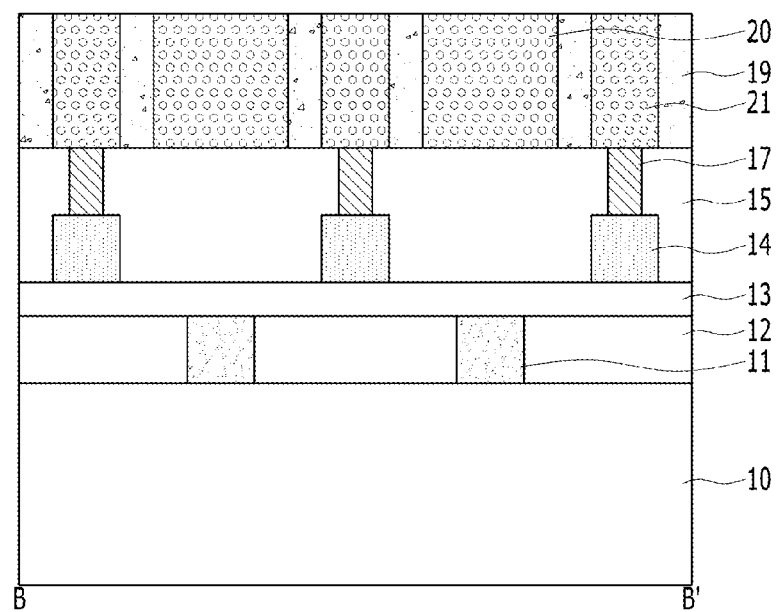

Referring to FIGS. 7A, 7B and 7C, a plurality of first pillar electrodes 20 and a plurality of second pillar electrodes 21 are formed to penetrate the third inter-layer dielectric layer 18. In a plan view of a cross-section, the first pillar electrodes 20 and the second pillar electrodes 21 may have a planar shape of a polygon, such as a triangle, a rectangle, a pentagon, or the like, or circle. The first pillar electrodes 20 and the second pillar electrodes 21 may include a metallic material.

The first pillar electrodes 20 may be spaced apart from each other, and they may be disposed in a matrix form. That is, in an embodiment, the first pillar electrodes 20 may be arranged in a plurality of rows extending in the first oblique direction DD1 and the second oblique direction DD2. The first pillar electrodes 20 may be arranged over the first conductive lines 11 so that they partially overlap with the first conductive lines 11 and are disposed in a region corresponding to the space between the second conductive lines 14. Some of the first pillar electrodes 20 may be in contact with the first contact plugs 16. The first pillar electrodes 20 may also contact outer sidewalls of the variable resistance layers 19.

The second pillar electrodes 21 may be spaced apart from each other and from adjacent first pillar electrodes 20. The second pillar electrodes 21 may be arranged in a matrix form including a plurality of rows extending in the first oblique direction DD1 and the second oblique direction DD2. The second pillar electrodes 21 may be arranged over the second conductive lines 14 so that they partially overlap with the second conductive lines 14 and are disposed in a region corresponding to the space between the first conductive lines 11. Some of the second pillar electrodes 21 may be in contact with the second contact plugs 17. Each of the second pillar electrodes 21 may contact an inner sidewall of a corresponding one of the variable resistance layers 19. In an embodiment, each of the second pillar electrodes 21 is surrounded or enclosed by a corresponding one of the variable resistance layers 19.

The first pillar electrodes 20 and the second pillar electrodes 21 may be formed by selectively etching the third inter-layer dielectric layer 18 to form a plurality of openings penetrating the third inter-layer dielectric layer 18, filling the openings with a conductive material, and performing a planarization process until a top surface of the third inter-layer dielectric layer 18 is exposed. As a result, the first and second pillar electrodes 20 and 21 are isolated from each other. Herein, the planarization process may be a Chemical Mechanical Polishing (CMP) or a blanket etch process. The first pillar electrodes 20 and the second pillar electrodes 21 may be formed concurrently or through different processes.

Although in the embodiments described above the variable resistance layers 19 are formed before the formation of the first pillar electrodes 20 and the second pillar electrodes 21, embodiments are not limited thereto. The variable resistance layers 19 may be formed after the formation of the first pillar electrodes 20 and the second pillar electrodes 21 in accordance with another embodiment.

Figure 8A:
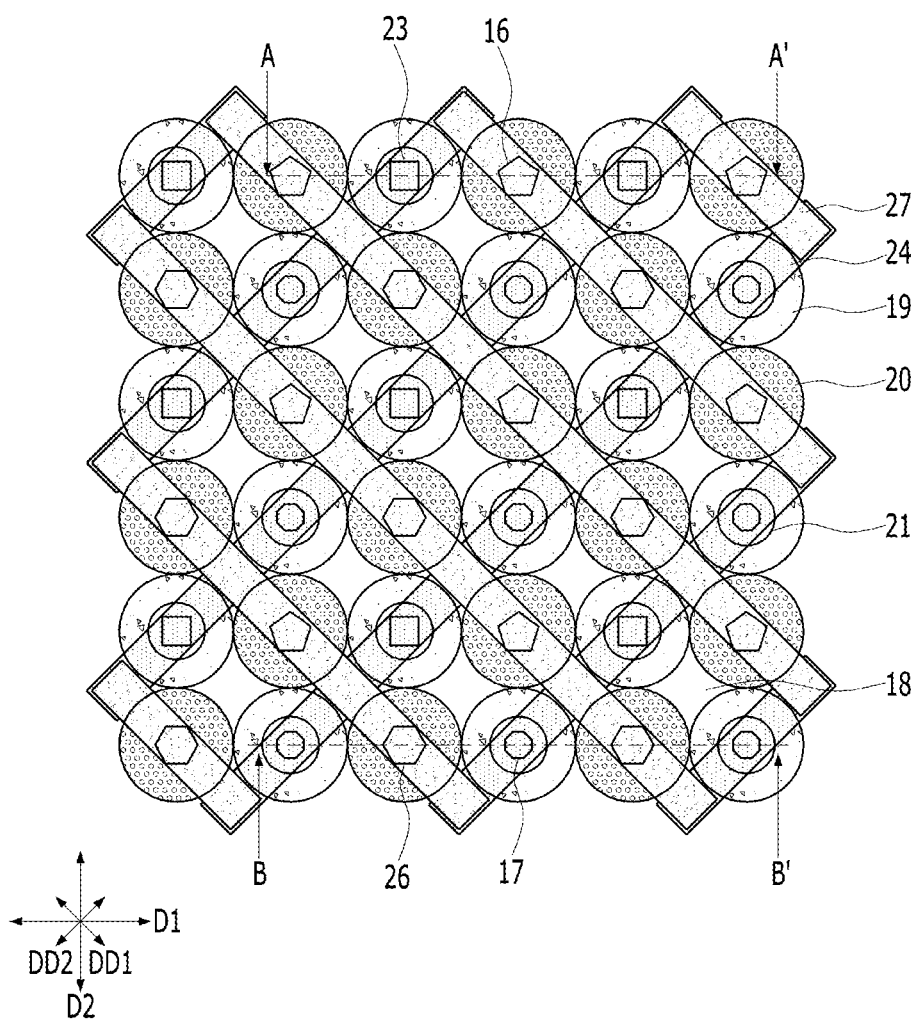
Figure 8B:
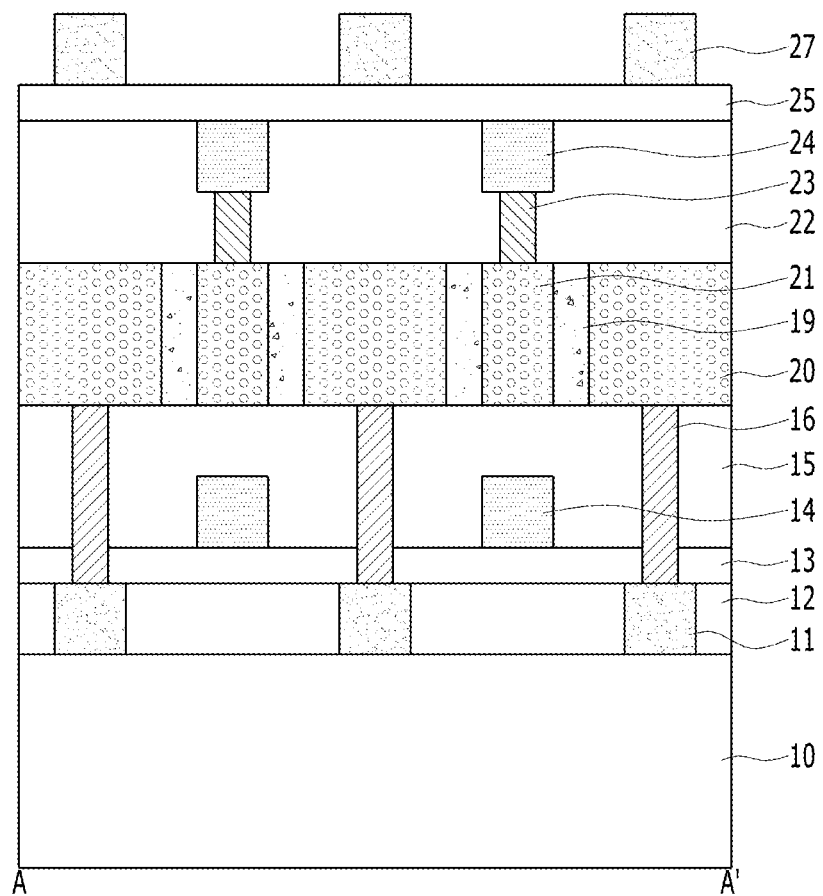
Figure 8C:
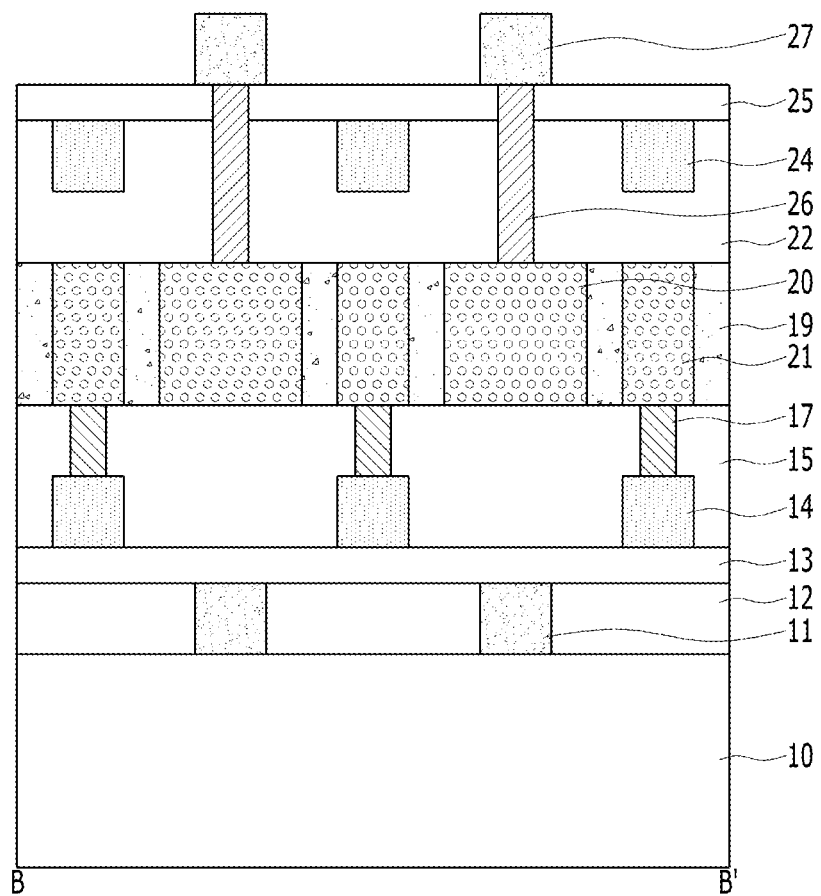

Referring to FIGS. 8A, 8B and 8C, a fourth inter-layer dielectric layer 22 is formed over a resultant structure including the variable resistance layers 19 and the first and second pillar electrodes 20 and 21. The fourth inter-layer dielectric layer 22 may include at least one of an oxide, a nitride and an oxynitride. In an embodiment, the fourth inter-layer dielectric layer 22 is an oxide layer.

Subsequently, a plurality of third contact plugs 23 is formed to penetrate the fourth inter-layer dielectric layer 22 so that they are in contact with corresponding second pillar electrodes 21, and a plurality of third conductive lines 24 is formed to be in contact with corresponding third contact plugs 23. The third conductive lines 24 are formed in the fourth inter-layer dielectric layer 22. The third conductive lines 24 may extend in the second oblique direction DD2 and may be spaced apart from each other in the first oblique direction DD1. The third conductive lines 24 may overlap with the second conductive lines 14. The third contact plugs 23 may be alternately disposed with the second contact plugs 17 in the second oblique direction DD2 along the second and third conductive lines 14 and 24. Accordingly, the second contact plugs 17 and the third contact plugs 23 arranged along a line in the second oblique direction DD2 may be alternately coupled to corresponding second pillar electrodes 21 arranged along the same line in the second oblique direction DD2. The third conductive lines 24 and the third contact plugs 23 may include a metallic material.

The third conductive lines 24 and the third contact plugs 23 may be simultaneously formed through a dual damascene process. In an embodiment, the third conductive lines 24 and the third contact plugs 23 are formed by selectively etching the fourth inter-layer dielectric layer 22 so as to form a dual damascene pattern including via holes, which expose some of the second pillar electrodes 21, and line-type trenches that overlap with the second conductive lines 14, filling the dual damascene pattern with a conductive material, and performing a planarization process until a top surface of the fourth inter-layer dielectric layer 22 is exposed. As a result, the third conductive lines 24 are isolated from each other. Herein, the planarization process may be a Chemical Mechanical Polishing (CMP) process or a blanket etch process.

Subsequently, a fifth inter-layer dielectric layer 25 is formed over a resultant structure including the third conductive lines 24. The fifth inter-layer dielectric layer 25 may include at least one of an oxide, a nitride and an oxynitride. In an embodiment, the fifth inter-layer dielectric layer 25 is a nitride layer.

Subsequently, a plurality of fourth contact plugs 26 is formed to penetrate the fifth inter-layer dielectric layer 25 and the fourth inter-layer dielectric layer 22 and to be in contact with the first pillar electrodes 20. The fourth contact plugs 26 may be alternately disposed with the first contact plugs 16 in the first oblique direction DD1 along the first conductive lines 11. Accordingly, the first contact plugs 16 and the fourth contact plugs 26 may be alternately coupled to the first pillar electrodes 20 in the first oblique direction DD1. The fourth contact plugs 26 may include a metallic material.

Subsequently, a plurality of fourth conductive lines 27 is formed to be in contact with the fourth contact plugs 26 over the fifth inter-layer dielectric layer 25. The fourth conductive lines 27 may extend in the first oblique direction DD1 and be spaced apart from each other in the second oblique direction DD2. The fourth conductive lines 27 may overlap with the first conductive lines 11. The fourth conductive lines 27 may include a metallic material.

According to embodiments of the present disclosure, since a plurality of memory cells of a semiconductor memory is implemented by forming a group of adjacent first pillar electrodes 20 that are in contact with one variable resistance layers 19 among the variable resistance layers 19 that surround or enclose the second pillar electrodes 21, respectively, the degree of integration of the semiconductor memory may be increased.

Also, the contact area between the first pillar electrodes 20, the second pillar electrodes 21 and the variable resistance layers 19 may be easily controlled by forming the first pillar electrodes 20, the second pillar electrodes 21 and the variable resistance layers 19 in a pillar shape. Particularly, when embodiments of the present disclosure are applied to a phase-change memory in which the contact area between variable resistors and electrodes has an influence on operational characteristics of the phase-change memory, the operational characteristics of the memory may be improved.

In addition, since the variable resistance layers 19 are formed by filling openings with a variable resistance material instead of performing an etch process, a problem that would occur in performing an etch process to form the variable resistance layers 19 may be prevented.

The above and other memory circuits or semiconductor devices based on the disclosed technology can be used in a range of devices or systems. FIGS. 9-13 provide some examples of devices or systems that can implement the memory circuits disclosed herein.

Figure 9:
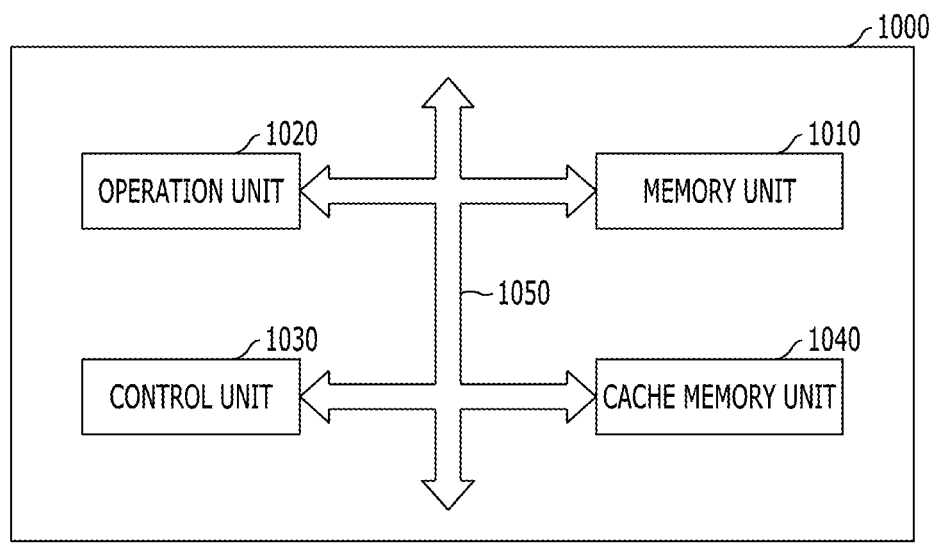
FIG. 9 is an example of configuration diagram of a microprocessor implementing memory circuitry based on the disclosed technology.

FIG. 9 is an example of configuration diagram of a microprocessor implementing memory circuitry based on the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of first pillar electrodes that are spaced apart from each other; a plurality of second pillar electrodes that are respectively spaced apart from the first pillar electrodes; and variable resistance layers surrounding the second pillar electrodes, respectively, wherein a group of the first pillar electrodes contact with one variable resistance layer surrounding one second pillar electrode among the second pillar electrodes, and simultaneously, a group of the variable resistance layers contact with one first pillar electrode among the first pillar electrodes. Through this, the integration degree of the memory unit 1010 and the microprocessor 1000 may be remarkably increased.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
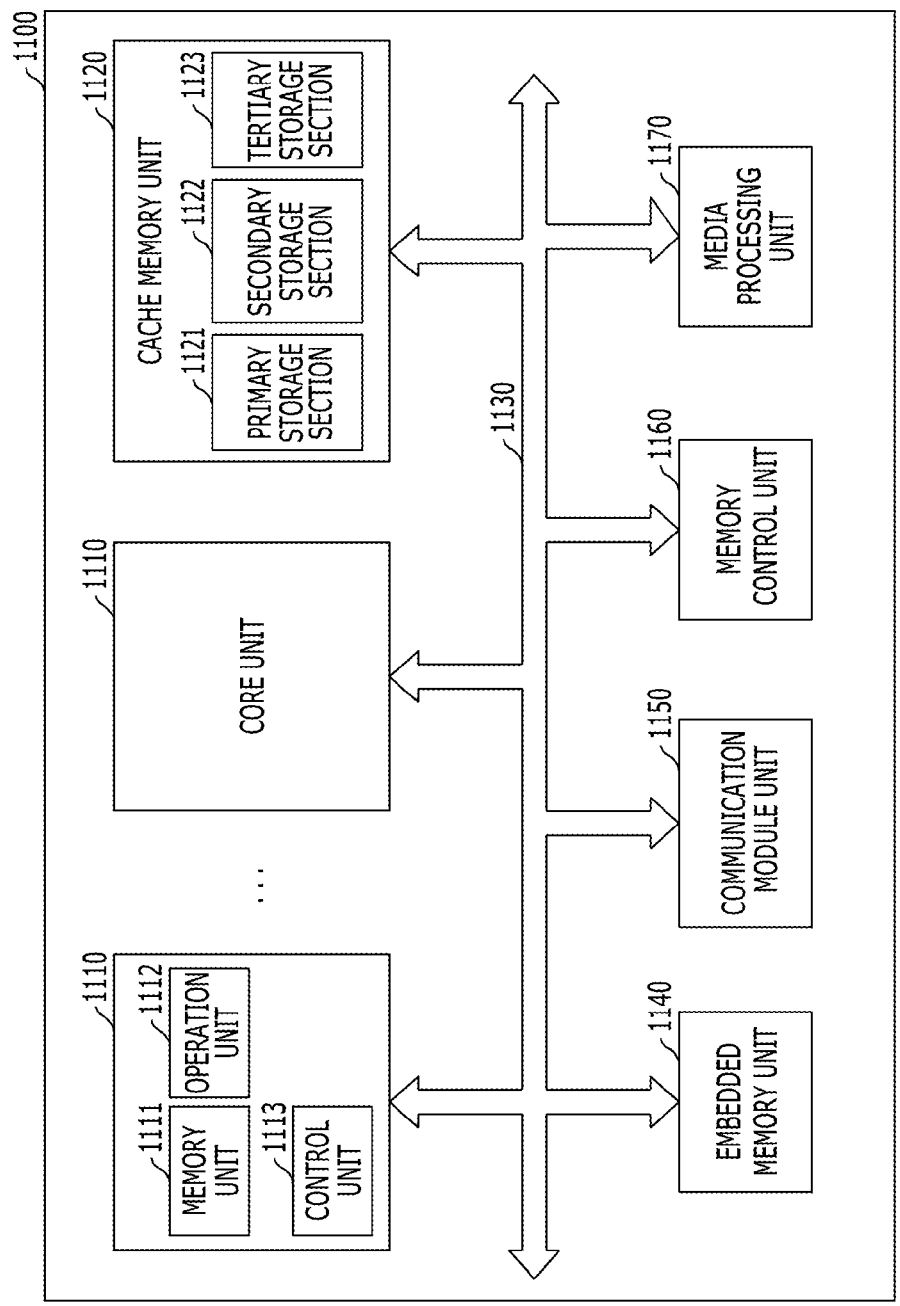
FIG. 10 is an example of configuration diagram of a processor implementing memory circuitry based on the disclosed technology.

FIG. 10 is an example of configuration diagram of a processor implementing memory circuitry based on the disclosed technology.

Referring to FIG. 10, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of first pillar electrodes that are spaced apart from each other; a plurality of second pillar electrodes that are respectively spaced apart from the first pillar electrodes; and variable resistance layers surrounding the second pillar electrodes, respectively, wherein a group of the first pillar electrodes contact with one variable resistance layer surrounding one second pillar electrode among the second pillar electrodes, and simultaneously, a group of the variable resistance layers contact with one first pillar electrode among the first pillar electrodes. Through this, the integration degree of the cache memory unit 1120 and the processor 1100 may be remarkably increased.

Although it was shown in FIG. 10 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
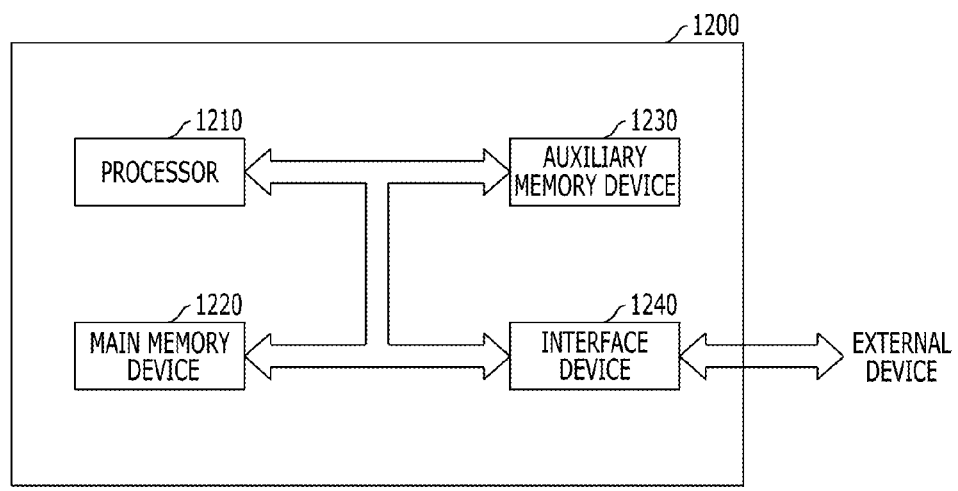
FIG. 11 is an example of configuration diagram of a system implementing memory circuitry based on the disclosed technology.

FIG. 11 is an example of configuration diagram of a system implementing memory circuitry based on the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of first pillar electrodes that are spaced apart from each other; a plurality of second pillar electrodes that are respectively spaced apart from the first pillar electrodes; and variable resistance layers surrounding the second pillar electrodes, respectively, wherein a group of the first pillar electrodes contact with one variable resistance layer surrounding one second pillar electrode among the second pillar electrodes, and simultaneously, a group of the variable resistance layers contact with one first pillar electrode among the first pillar electrodes. Through this, the integration degree of the main memory device 1220 and the system 1200 may be remarkably increased.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of first pillar electrodes that are spaced apart from each other; a plurality of second pillar electrodes that are respectively spaced apart from the first pillar electrodes; and variable resistance layers surrounding the second pillar electrodes, respectively, wherein a group of the first pillar electrodes contact with one variable resistance layer surrounding one second pillar electrode among the second pillar electrodes, and simultaneously, a group of the variable resistance layers contact with one first pillar electrode among the first pillar electrodes. Through this, the integration degree of the auxiliary memory device 1230 and the system 1200 may be remarkably increased.

Also, the auxiliary memory device 1230 may further include a data storage system (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 12:
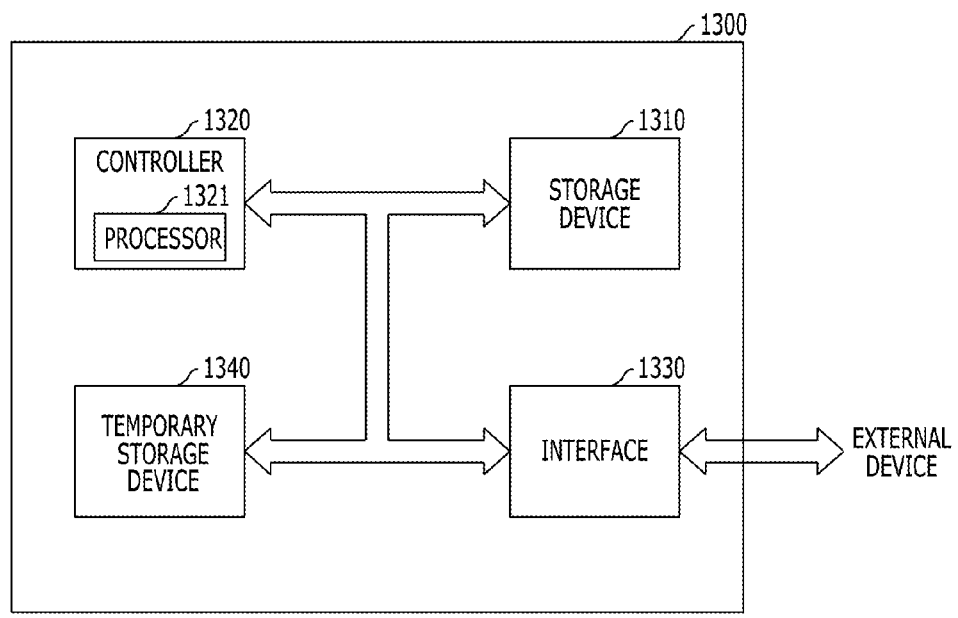
FIG. 12 is an example of configuration diagram of a data storage system implementing memory circuitry based on the disclosed technology.

FIG. 12 is an example of configuration diagram of a data storage system implementing memory circuitry based on the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a plurality of first pillar electrodes that are spaced apart from each other; a plurality of second pillar electrodes that are respectively spaced apart from the first pillar electrodes; and variable resistance layers surrounding the second pillar electrodes, respectively, wherein a group of the first pillar electrodes contact with one variable resistance layer surrounding one second pillar electrode among the second pillar electrodes, and simultaneously, a group of the variable resistance layers contact with one first pillar electrode among the first pillar electrodes. Through this, the integration degree of the temporary storage device 1340 and the data storage system 1300 may be remarkably increased.

Figure 13:
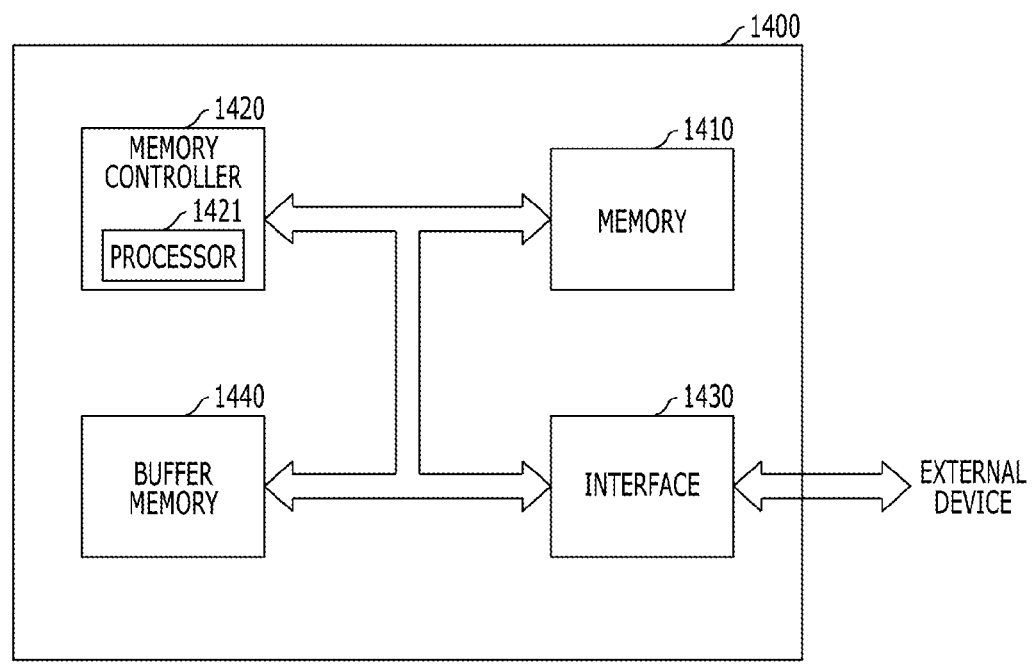
FIG. 13 is an example of configuration diagram of a memory system implementing memory circuitry based on the disclosed technology.

FIG. 13 is an example of configuration diagram of a memory system implementing memory circuitry based on the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of first pillar electrodes that are spaced apart from each other; a plurality of second pillar electrodes that are respectively spaced apart from the first pillar electrodes; and variable resistance layers surrounding the second pillar electrodes, respectively, wherein a group of the first pillar electrodes contact with one variable resistance layer surrounding one second pillar electrode among the second pillar electrodes, and simultaneously, a group of the variable resistance layers contact with one first pillar electrode among the first pillar electrodes. Through this, the integration degree of the memory 1410 and the memory system 1400 may be remarkably increased.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 may include a plurality of first pillar electrodes that are spaced apart from each other; a plurality of second pillar electrodes that are respectively spaced apart from the first pillar electrodes; and variable resistance layers surrounding the second pillar electrodes, respectively, wherein a group of the first pillar electrodes contact with one variable resistance layer surrounding one second pillar electrode among the second pillar electrodes, and simultaneously, a group of the variable resistance layers contact with one first pillar electrode among the first pillar electrodes. Through this, the integration degree of the buffer memory 1440 and the memory system 1400 may be remarkably increased.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 9-13 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
   a plurality of first pillar electrodes spaced apart from each other;
   a plurality of second pillar electrodes spaced apart from each other, each second pillar electrode being spaced apart from adjacent first pillar electrodes; and
   a plurality of variable resistance layers enclosing sidewalls of corresponding second pillar electrodes, respectively,
   wherein a group of adjacent first pillar electrodes is in contact with one variable resistance layer, and a group of adjacent variable resistance layers is in contact with one first pillar electrode.

2. The electronic device according to claim 1, further comprising:
   a plurality of selection element layers interposed between the first pillar electrodes and the variable resistance layers or between the second pillar electrodes and the variable resistance layers.

3. The electronic device according to claim 1, wherein the group of adjacent first pillar electrodes includes first pillar electrodes disposed on opposite sides of the one variable resistance layer in a first direction and a second direction, the second direction crossing the first direction, and
   wherein the group of adjacent variable resistance layers includes variable resistance layers disposed on opposite sides of the one first pillar electrode in the first direction and the second direction.

4. The electronic device according to claim 1, wherein the first pillar electrodes and the second pillar electrodes are alternately disposed in the first direction and the second direction.

5. The electronic device according to claim 1, wherein the first pillar electrodes and the second pillar electrodes include a planar shape of a circle or a polygon including any of a triangle, a rectangle, and a pentagon.

6. The electronic device according to claim 1, wherein the second pillar electrodes penetrate the variable resistance layers so that the sidewalls of the corresponding second pillar electrodes are enclosed by the variable resistance layers, respectively.

7. The electronic device according to claim 1, wherein the variable resistance layers have substantially the same height as the first pillar electrodes and the second pillar electrodes, or the variable resistance layers have smaller height than the first pillar electrodes and the second pillar electrodes.

8. The electronic device according to claim 1, wherein the variable resistance layers include a metal oxide, a phase-change material, a ferroelectric material, or a ferromagnetic material.

9. The electronic device according to claim 1, further comprising a microprocessor which includes:
   a control unit configured to receive a signal including a command from an outside of the microprocessor, and performs extracting, decoding of the command, or controlling input or output of a signal of the microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory unit that includes the variable resistance layers is part of the memory unit in the microprocessor.

10. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory unit that includes the variable resistance layers is part of the cache memory unit in the processor.

11. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the variable resistance layers is part of the auxiliary memory device or the main memory device in the processing system.

12. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory unit that includes the variable resistance layers is part of the storage device or the temporary storage device in the data storage system.

13. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory unit that includes the variable resistance layers is part of the memory or the buffer memory in the memory system.

* * * * *